United States Patent
Sankaran et al.

(10) Patent No.: US 9,166,619 B2
(45) Date of Patent: Oct. 20, 2015

(54) METHOD AND SYSTEM FOR PATTERN-BASED COMPRESSION

(71) Applicant: Verizon Patent and Licensing Inc., Basking Ridge, NJ (US)

(72) Inventors: Anand N. Sankaran, Tamil Nadu (IN); Anierutha X. Chandhiramowuli, Chennai (IN); SyedTalat Iqbal, Chennai (IN); Rajesh Narayanan, Chennai (IN); Jubish C. Parambath, Chennai (IN); Anil K. Guntupalli, Irving, TX (US); Lisa A. Caputo, Dade City, FL (US)

(73) Assignee: Verizon Patent and Licensing Inc., Basking Ridge, NJ (US)

( * ) Notice: Subject to any disclaimer, the term of this patent is extended or adjusted under 35 U.S.C. 154(b) by 218 days.

(21) Appl. No.: 13/732,560

(22) Filed: Jan. 2, 2013

(65) Prior Publication Data
US 2014/0188900 A1     Jul. 3, 2014

(51) Int. Cl.
| | | |
|---|---|---|
| *G06F 7/00* | (2006.01) | |
| *G06F 17/00* | (2006.01) | |
| *G06F 17/30* | (2006.01) | |
| *G06Q 30/00* | (2012.01) | |
| *H03M 7/30* | (2006.01) | |
| *G06Q 30/06* | (2012.01) | |
| *G06F 15/16* | (2006.01) | |

(52) U.S. Cl.
CPC ......... *H03M 7/3084* (2013.01); *G06F 17/3053* (2013.01); *G06F 17/30153* (2013.01); *G06Q 30/0601* (2013.01); *H03M 7/30* (2013.01); *H03M 7/3097* (2013.01)

(58) Field of Classification Search
CPC ......... G06F 17/30153; G06F 17/3053; H03M 7/30; G06Q 30/0601
USPC .................................. 705/26.1; 707/693, 749
See application file for complete search history.

(56) References Cited

U.S. PATENT DOCUMENTS

| | | | |
|---|---|---|---|
| 7,026,962 B1 * | 4/2006 | Emami et al. .................... | 341/51 |
| 7,370,120 B2 * | 5/2008 | Kirsch et al. ................ | 707/999.1 |
| 7,630,996 B1 * | 12/2009 | Hershkovich et al. . | 707/999.101 |
| 8,533,166 B1 * | 9/2013 | Sulieman et al. ............. | 707/693 |
| 2002/0010758 A1 * | 1/2002 | Chan ............................ | 709/218 |
| 2008/0275897 A1 * | 11/2008 | Iyer et al. ............... | 707/999.101 |
| 2009/0079597 A1 * | 3/2009 | McCanne et al. ............... | 341/51 |

* cited by examiner

*Primary Examiner* — Usmaan Saeed
*Assistant Examiner* — Brian E. Weinrich

(57) ABSTRACT

There is an approach for generating a pattern-based database. The approach includes accessing a log specifying one or more strings representing data having a dynamic portion and a static portion. The approach also may include generating a pattern-based database, including one or more records representing compression of the data, by determining the dynamic portions and the static portions of the strings. The approach also may include assigning pattern values to the strings based on the determined dynamic portions and the static portions. The pattern values may be configured to provide compression of the strings within the records of the pattern-based database.

18 Claims, 11 Drawing Sheets

METHOD AND SYSTEM FOR PATTERN-BASED COMPRESSION

BACKGROUND INFORMATION

Proper management of data is required for organizations to perform their missions successfully. For example, modern business infrastructure, such as communication systems, create and log a vast amount of information that may be used to troubleshoot issues that may arise or perform data mining for determining answers for business questions. Additionally, business subsystems rely on storing enormous amounts of data in support of providing goods and services. One major challenge involves the storage of the ever growing volume of data produced. Traditional data compression algorithms would require significant processing power to deal with the need for real-time access of data, and thus, are not practical from a technical and cost perspective. Also, current database management systems largely utilize a relational model, which is not designed with data compression in mind.

Based on the foregoing, there is a need for a database management system and approach that store data as to achieve compression gains.

BRIEF DESCRIPTION OF THE DRAWINGS

Various exemplary embodiments are illustrated by way of example, and not by way of limitation, in the figures of the accompanying drawings in which like reference numerals refer to similar elements and in which.

DESCRIPTION OF THE PREFERRED EMBODIMENT

An apparatus, method, and software for compressing data by generating a pattern-based database are described. In the following description, for the purposes of explanation, numerous specific details are set forth in order to provide a thorough understanding of the present invention. It is apparent, however, to one skilled in the art that the present invention may be practiced without these specific details or with an equivalent arrangement. In other instances, well-known structures and devices are shown in block diagram form in order to avoid unnecessarily obscuring the present invention.

Although the various exemplary embodiments are described with respect to processing data generated by computing systems in support of telecommunication services, it is contemplated that these embodiments have applicability to systems operated by different organizations and to other operations.

Figure 1A:
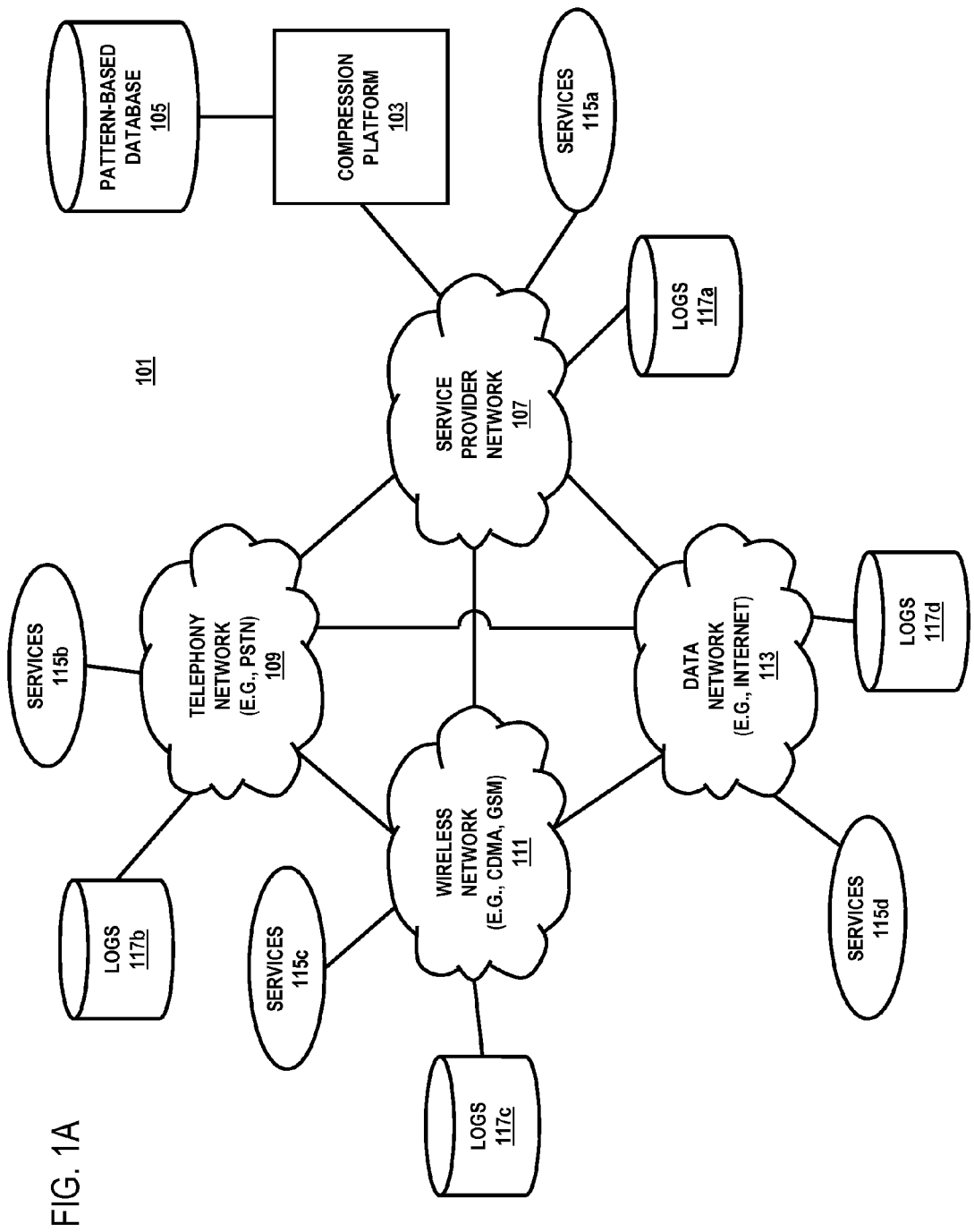
FIG. 1A is a diagram of a system including one or more logs of information that are compressed by generating a pattern-based database, according to an exemplary embodiment.

FIG. 1A is a diagram of a system capable of storing information in terms of patterns and behaviors instead of storing the complete data, thereby compressing the stored data with a pattern-based database. With the advent of information processing, business intelligence has been created that allows for a best set of practices for building data mining problems to provide answers for business questions, such as answers pertaining to the systems. Dimensional modeling was created as a way of storing information or data (also known as facts) as a structure having a center that is surrounded by one or more descriptive tables (also known as dimensional tables). Thus, a denormalized relational database is a core structure for existing data structures. However, a lot of redundant data is stored in order to make the mining process efficient and faster. With a desire to store data at the most granular level to be able to extract the most information, the amount of space that is required to store the data is increasing exponentially. Although space is sometimes not a constraint because of advancements in storage technology, the redundant data leads to many data reads, which affects the efficiency of processing a model.

The approach of the system 101 stems, in part, from the recognition that a different type of database is required in scenarios requiring the storage of complete data without losing the information available within the data, such as at the most granular level, but while still reducing the redundancy of the data. The approach of the system 101 allows for storing data in the form of patterns by analyzing different components of the data and storing the information that is required to reassemble the data based on the determined patterns.

As shown, the system 101 includes a compression platform 103 implemented as, for example, part of a service provider network 107 for generating a pattern-based database by determining patterns in log information associated with the service provider network 107. The compression platform 103 accesses information stored in one or more logs, which may include millions of strings of information acquired from the processes and/or functions executed as part of a system. The compression platform 103 then analyzes the information to extract patterns from the information and store the information based on the patterns representing static portions of the information, in addition to the dynamic portions.

The compression platform 103 may be associated with a pattern-based database 105 that is created by the compression platform 103 after processing information (e.g., strings) stored in one or more logs. By way of example, the service provider network 107 may include one or more services 115a. The one or more services 115a may execute one or more processes and/or operations that generate log information that is stored at one or more logs 117a associated with the service provider network 107. The vast amount of data or information that is stored at the logs 117a may be processed by the compression platform 103 to compress the information by generating a pattern-based database 105.

Although the compression platform 103 is illustrated as part of the service provider network 107, in alternative embodiments the compression platform 103 may be implemented as any part of the system 101, such as associated with other networks. Further, although the pattern-based database 105 is illustrated as being separate from the logs 117a-117d and associated with the service provider network 107, in one embodiment the pattern-based database 105 may be created within one or more of the logs 117a-117d and/or may be associated with one or more of the other networks.

The service provider network 107 can interact with one or more other networks, such as a telephony network 109, a wireless network 111, and/or a data network 113. As discussed above, the service provider network 107 can include one or more services 115a, which may include any kind of process and/or function executed by the service provider network 107 that generates information. The information may be stored by one or more logs 117. Similarly, the telephony network 109, the wireless network 111 and the data network 113 may include one or more services 115b, 115c and 115d, respectively, that generate information and that may be stored in logs 117b, 117c and 117d, respectively. However, in one embodiment, such as where the networks 107-113 are controlled, maintained and/or operated by the same entity, the information generated by the services 115a-115d may be stored at the same log such that, for example, the log 117a stores information for all four services 115a-115d.

For illustrative purposes, the networks 107-113 may be any suitable wireline and/or wireless network, and be managed by one or more service providers. For example, telephony network 109 may include a circuit-switched network, such as the public switched telephone network (PSTN), an integrated services digital network (ISDN), a private branch exchange (PBX), or other like network. The wireless network 111 may employ various technologies including, for example, code division multiple access (CDMA), enhanced data rates for global evolution (EDGE), general packet radio service (GPRS), mobile ad hoc network (MANET), global system for mobile communications (GSM), Internet protocol multimedia subsystem (IMS), universal mobile telecommunications system (UMTS), etc., as well as any other suitable wireless medium, e.g., microwave access (WiMAX), wireless fidelity (WiFi), satellite, and the like. Meanwhile, the data network 113 may be any local area network (LAN), metropolitan area network (MAN), wide area network (WAN), the Internet, or any other suitable packet-switched network, such as a commercially owned, proprietary packet-switched network, such as a proprietary cable or fiber-optic network.

Although depicted as separate entities, networks 107-113 may be completely or partially contained within one another, or may embody one or more of the aforementioned infrastructures. For instance, the service provider network 107 may embody circuit-switched and/or packet-switched networks that include facilities to provide for transport of circuit-switched and/or packet-based communications. It is further contemplated that networks 107-113 may include components and facilities to provide for signaling and/or bearer communications between the various components or facilities of system 101. In this manner, networks 107-113 may embody or include portions of a signaling system 7 (SS7) network, or other suitable infrastructure to support control and signaling functions.

According to exemplary embodiments, end user devices (not shown) may be utilized to communicate over system 101 and may include any customer premise equipment (CPE), such as a set-top box (STB), capable of sending and/or receiving information over one or more of networks 107-113. For instance, voice terminal may be any suitable plain old telephone service (POTS) device, facsimile machine, etc., whereas mobile device (or terminal) may be any cellular phone, radiophone, satellite phone, smart phone, wireless phone, or any other suitable mobile device, such as a personal digital assistant (PDA), pocket personal computer, tablet, customized hardware, etc. Further, computing device may be any suitable computing device, such as a VoIP phone, skinny client control protocol (SCCP) phone, session initiation protocol (SIP) phone, IP phone, personal computer, softphone, workstation, terminal, server, etc.

The compression platform 103 processes strings of information (e.g., alphanumeric characters) stored in one or more logs to determine dynamic portions and static portions of the strings. The compression platform 103 then assigns pattern values to the strings based on the dynamic and static portions, where the pattern values are used to provide the compression of the static portions within the pattern-based database 105. By way of example, strings of information may be stored in the log 117a of the service provider network 107 associated with, for example, processes executed by a STB at a customer's premise. An exemplary string stored in the log 117a of the service provider network 107 may be:

DEV_ID:DEV539060|RFTTx_Id:|TransactionDateTime: 2010/6/24|Module:LUA|Item_Serial_Num:|Price: 0.99|Quote:|Quantity:|Category:|Type:0|ErrorCode: 1|App_Id:2150|Leadsrc:WB The string may be from a STB with an ID of DEV539060 that performed a function on 2010/6/24 operating a module called LUA with a price of 0.99 of type 0 with an APP_ID 2150 launched from the Leadsrc of WB. Thus, such a string may denote a list of key-value pairs with each pair being separated by the delimiter '|' and the keys being separated from the values with the delimiter ':'. In one embodiment, the compression platform 103 may access logs storing strings according to the foregoing. However, the compression platform 103 may also process information stored within the logs in other formats, as discussed below, where the compression platform 103 can understand determine static and dynamic portions of the information. Understanding the format of the strings, such as the delimiters, is enough to form patterns without getting into detailed semantics. By way of example, the compression platform 103 may access the following three strings from a log:

(1)  DEV_ID:1719|RFTTx_Id:|TransactionDateTime: 2010/6/24|Module:LUA|Item_Serial_Num:|Price: 0.99|Quote:|Quantity:|Category:|Type:0|ErrorCode: 1|App_Id:2150|Leadsrc:301

(2)  DEV_ID:b183|RFTTx_Id:|TransactionDateTime: 2010/6/24|Module:LUA|Item_Serial_Num:|Price: 0.99|Quote:|Quantity:|Category:|Type:0|ErrorCode: 1|App_Id:2150|Leadsrc:301

(3)  DEV_ID:1097|RFTTx_Id:|TransactionDateTime: 2010/6/24|Module:LUA|Item_Serial_Num:|Price: 0.99|Quote:|Quantity:|Category:|Type:0|ErrorCode: 1|App_Id:2150|Leadsrc:301

In the above examples, a major part of the string remains constant. The only variable parts of the above examples are the values corresponding to the key DEV_ID. Hence, in this case, there exists some parts of the strings that remain constant for the whole set or a sufficiently large subset. Therefore, in the above set, the 3 strings can be replaced by a pattern which can be named as 'A' and correspond to:

(A)  DEV_ID:????|RFTTx_Id:|TransactionDateTime: 2010/6/24|Module:LUA|Item_Serial_Num:|Price: 0.99|Quote:|Quantity:|Category:|Type:0|ErrorCode: 1|App_Id:2150|Leadsrc:301 where the ???? represents the dynamic part of the strings and the rest can be replaced by the pattern (A). Thus, the three strings can be stored in their simplest form in a pattern-based database as:

(1) A-1719
(2) A-b183
(3) A-1097

The above examples are simplified to illustrate the process of determining the static and dynamic portions of strings. In one embodiment, the compression platform 103 can perform additional analysis where, for example, the variation in the strings is larger than the variation of the three strings provided above. By way of example, for three strings there may be multiple dynamic portions in multiple dynamic keys. Specifically, the compression platform 103 may access the following three strings:

(1) DEV_ID:1719|RFTTx_Id:|TransactionDateTime: 2010/6/24|Module:LUA|Item_Serial_Num:|Price: 0.99|Quote:|Quantity:|Category:|Type:0|ErrorCode: 1|App_Id:2150|Leadsrc:301

(2) DEV_ID:b183|RFTTx_Id:|TransactionDateTime: 2010/6/24|Module:LUA|Item_Serial_Num:|Price: 0.99|Quote:|Quantity:|Category:|Type:0|ErrorCode: 1|App_Id:2150|Leadsrc:301

(3) DEV_ID:1097|RFTTx_Id:|TransactionDateTime: 2010/6/24|Module:LUA|Item_Serial_Num:|Price: 0.99|Quote:|Quantity:|Category:|Type:0|ErrorCode: 1|App_Id:2150|Leadsrc:303

In the given set of strings, apart from the value corresponding to the key DEV_ID being dynamic, there exist values corresponding to the key Leadsrc that are dynamic. According to the simplified example discussed above, in such a case the compression platform 103 may form the pattern:

(A) DEV_ID:????|RFTTx_Id:|TransactionDateTime: 2010/6/24|Module:LUA|Item_Serial_Num:|Price: 0.99|Quote:|Quantity:|Category:|Type:0|ErrorCode: 1|App_Id:2150|Leadsrc:???

Based on the above pattern, out of the three strings, the first two have only one component as dynamic (corresponding to DEV_ID) and the last one also has the value corresponding to the key Leadsrc as dynamic. In one embodiment, this difference can be interpreted by the compression platform 103 based on (1) assuming that the value for Leadsrc is dynamic. In one embodiment, this difference can be interpreted by the compression platform 103 based on (2) the first pattern accommodating the value for Leadsrc as static as the value 301 is seen more than the value of 303.

Under the first case (1), the number of patterns would remain less to compress the data but the dynamic value that is required to store the compressed data string would increase. For example, the compressed strings for the three examples would be:

(1) A-1719,301
(2) A-b183,301
(3) A-1097,303 with a stored pattern of:

(A) DEV_ID:????|RFTTx_Id:|TransactionDateTime: 2010/6/24|Module:LUA|Item_Serial_Num:|Price: 0.99|Quote:|Quantity:|Category:|Type:0|ErrorCode: 1|App_Id:2150|Leadsrc:???

Under the second case (2), however, the number of patterns would increase, but the dynamic values that are required to store the compressed strings would decrease. For example, the compressed data for the three examples would be:

(1) A-1719
(2) A-b183
(3) B-1097,303 with the stored patterns of:

(A) DEV_ID:????|RFTTx_Id:|TransactionDateTime: 2010/6/24|Module:LUA|Item_Serial_Num:|Price: 0.99|Quote:|Quantity:|Category:|Type:0|ErrorCode: 1|App_Id:2150|Leadsrc:301

(B) DEV_ID:????|RFTTx_Id:|TransactionDateTime: 2010/6/24|Module:LUA|Item_Serial_Num:|Price: 0.99|Quote:|Quantity:|Category:|Type:0|ErrorCode: 1|App_Id:2150|Leadsrc:???

Based on the foregoing, the combined number of characters for storing the pattern and the compressed string by the first method (1) is much less than the number of characters used by the second method (1). Thus, in one embodiment, the compression platform 103 may take the first approach in generating a pattern-based database. The compression platform 103 may take this approach if, for example, the number of strings in the information is small.

In one embodiment, such as for a sufficiently large number of strings (which is common for large systems), the number of characters used under the second method (2) would be much less than the characters that would be required by the first method (1). In other words, storing an additional pattern to save a few characters in millions of string allows for greater compression. By way of example, storing an additional pattern including 30 characters is much less than storing an additional 4 characters for each one of two million records of compressed strings.

In the above examples, the strings are originally stored in the logs as key-value pairs and the dynamic values are stored in addition to a pattern representing the static portions. In one embodiment, the compression may be further generalized and extended to consider dynamic and static portions of the values of the key-value pairs. By way of example, the compression platform 103 may obtain the following three strings:

(1) DEV_ID:AB/CD/1719|RFTTx_Id:|TransactionDateTime:2010/6/24|Module:LUA|Item_Serial_Num: |Price:0.99|Quote:|Quantity:|Category:|Type:0|ErrorCode:1|App_Id:2150|Leadsrc:301

(2) DEV_ID:AB/CD/b183|RFTTx_Id:|TransactionDateTime:2010/6/24|Module:LUA|Item_Serial_Num: |Price:0.99|Quote:|Quantity:|Category:|Type:0|ErrorCode:1|App_Id:2150|Leadsrc:301

(3) DEV_ID:AB/CD/1097|RFTTx_Id:|TransactionDateTime:2010/6/24|Module:LUA|Item_Serial_Num: |Price:0.99|Quote:|Quantity:|Category:|Type:0|ErrorCode:1|App_Id:2150|Leadsrc:301

In the given set of strings, the values for the key DEV_ID are similar to each other. That is, the first few characters AB/CD/ remain constant while the last few characters are dynamic. In one embodiment, the compression platform 103 can take this into account for storing the same information with fewer characters. This is possible by considering the values as partial. By way of example, if the dynamic/static qualities of the values are not considered, then the corresponding compressed data and the pattern would be as follows:

(A) DEV_ID:???????????|RFTTx_Id:|TransactionDateTime:2010/6/24|Module:LUA|Item_Serial_Num: |Price:0.99|Quote:|Quantity:|Category:|Type:0|ErrorCode:1|App_Id:2150|Leadsrc:301

(1) A-AB/CD/1719
(2) A-AB/CD/b183
(3) A-AB/CD/1097

However, considering the values as partially static and dynamic, the same information can be stored with a small change in the pattern as:

(A) DEV_ID:AB/CD/????|RFTTx_Id:|TransactionDateTime:2010/6/24|Module:LUA|Item_Serial_Num:|Price: 0.99|Quote:|Quantity:|Category:|Type:0|ErrorCode:1|App_Id:2150|Leadsrc:301

(1) A-1719
(2) A-b183
(3) A-1097

The same logic can be applied with multiple partial values as discussed above such as where there are multiple values of key-value pairs that are partially dynamic and partially static. In one embodiment, whether the compression platform 103 determines a value as partial or dynamic depends on the complexity. The greater the number of patterns formed, the greater the complexity to build the compressed data and to regenerate the original data strings. Thus, in one embodiment, the compression platform 103 may base the decision in terms of a percentage, such as the percentage that is required to have a balance between the number of patterns formed and the number of values (fully or partially) being tagged as static and dynamic.

In one embodiment, the compression platform 103 determines the values to be partially dynamic and removes the dependency of the data string being in a key-value format.

multiple value strings or any combination. Where the values are removed from the original strings, such as when they are removed from the keys of key-value pairs, the compression platform 103 may include a pattern that represents the formatting of the original string, such as including the corresponding original keys.

In one embodiment, the compression platform 103 can apply the above techniques to formats other than strings, such as to tables. By way of example, tables stored within a log may be formatted to include columns and corresponding column headers or identifiers such that each column can be treated as a key and the value can be the data in each record of a column. According to this approach, the records in a table can be concatenated to form a string. By way of a specific example, the data stored in a fact table from a relational database model or by dimensional modeling may be:

TABLE 1

Exemplary fact table.

| STBID | TransactionDateTime | Module | Price | Type | ErrorCode | AppID | LeadSrc |
|---|---|---|---|---|---|---|---|
| AB/CD/1719 | 2010/6/24 | LUA | 0.99 | 0 | 1 | 2150 | 301 |
| AB/CD/b183 | 2010/6/24 | LUA | 0.99 | 0 | 1 | 2150 | 301 |
| AB/CD/a124 | 2010/6/24 | LUA | 0.99 | 0 | 1 | 2150 | 301 |
| AB/CD/5423 | 2010/6/24 | LUA | 0.99 | 0 | 1 | 2150 | 301 |
| AB/CD/4154 | 2010/6/24 | LUA | 0.99 | 0 | 1 | 2150 | 302 |
| AB/CD/47f4 | 2010/6/24 | LUA | 0.99 | 0 | 1 | 2150 | 303 |
| AB/CD/20c5 | 2010/6/24 | LUA | 0.99 | 0 | 1 | 2150 | 301 |

The compression platform 103, by removing the dependency, facilitates the pattern-determination and compression without requiring the format of the string, such as if the data strings are plain, key-value pairs, single key multiple value strings or any combination. For example, if the keys are removed from strings and the strings are stored as just plain text without any delimiters, or if the compression platform 103 removes the keys prior to processing, then processes the following data strings:
(1) AB/CD/17192010/6/240.99012150301
(2) AB/CD/b1832010/6/240.99012150301
(3) AB/CD/a1242010/6/240.99012150301
(4) AB/CD/54232010/6/240.99012150301
(5) AB/CD/41542010/6/240.99012150302
(6) AB/CD/47f42010/6/240.99012150303
(7) AB/CD/20c52010/6/240.99012150301
From the above strings, there exists a pattern with the first 6 characters repeating in all strings followed by 4 dynamic characters followed by 22 characters being static in strings numbered 1, 2, 3, 4, 7 and 21 characters being static in strings 5 and 6 (on an assumption that these strings represent the whole population in an approximate ratio). These strings can be compressed based on the following patterns:
(A) AB/CD/????2010/6/240.99012150301
(B) AB/CD/????2010/6/240.9901215030?
and the compressed strings may be represented as:
(1) A-1719
(2) A-b183
(3) A-a124
(4) A-5423
(5) B-41541
(6) B-47f43
(7) A-20c5

Thus, the compression platform 103 allows for even further compression based on finding patterns within strings stored within a log independent of how the strings are originally stored in the log, such as plain, key-value pairs, single key A columnID may be assigned to each column, such as STBID=1, TransactionDataTime=2, etc. such that the concatenated strings for the above table can be represented according to:
(1) 1=AB/CD/1719|2=2010/6/24|3=LUA|4=0.99|5=0|6=1|7=2150|8=301
(2) 1=AB/CD/b183|2=2010/6/24|3=LUA|4=0.99|5=0|6=1|7=2150|8=301
(3) 1=AB/CD/a124|2=2010/6/24|3=LUA|4=0.99|5=0|6=1|7=2150|8=301
(4) 1=AB/CD/5423|2=2010/6/24|3=LUA|4=0.99|5=0|6=1|7=2150|8=301
(5) 1=AB/CD/4154|2=2010/6/24|3=LUA|4=0.99|5=0|6=1|7=2150|8=301
(6) 1=AB/CD/47f4|2=2010/6/24|3=LUA|4=0.99|5=0|6=1|7=2150|8=301
(7) 1=AB/CD/20c5|2=2010/6/24|3=LUA|4=0.99|5=0|6=1|7=2150|8=301

The result is information similar to the strings including the key-value pairs discussed above. Accordingly, additional processing by the compression platform 103 may occur based on the methodology discussed above to extract patterns from the information and then store the strings according to the pattern-based compression thus allowing the compression of a relational database model.

In one embodiment, the large volume of data that the compression platform 103 analyzes and compresses is stored in a format that not only achieves compression gains, but assists with performing data analytics. The pattern values that are formed provide a kind of behavior for a group of processes, functions (or even people) that are represented by the original strings. The patterns allow for identification of some of the basic behavior without running additional queries. Each pattern value may be something for a sufficiently large set of records, thus making the use of pattern-based database saves storage space and provides immediate data analytics.

The above techniques may be implemented by the compression platform 103 according to any technique that may recursively determine patterns in strings by determining static and dynamic portions of the strong, and subsequently storing the strings as pattern keys and dynamic portions.

In one embodiment, by way of a specific example, the compression platform 103 may determine the patterns within the information based on the Hidden Markov Model modified to be recursive and overlapping such that the hidden states can undergo changes recursively depending on the input and different sequences of states that are generated within the same set of data but for different data points. Under this approach, a set of strings from a log are accessed by the compression platform 103 to identify patterns within the strings to generate a pattern-based database.

Figure 1B:
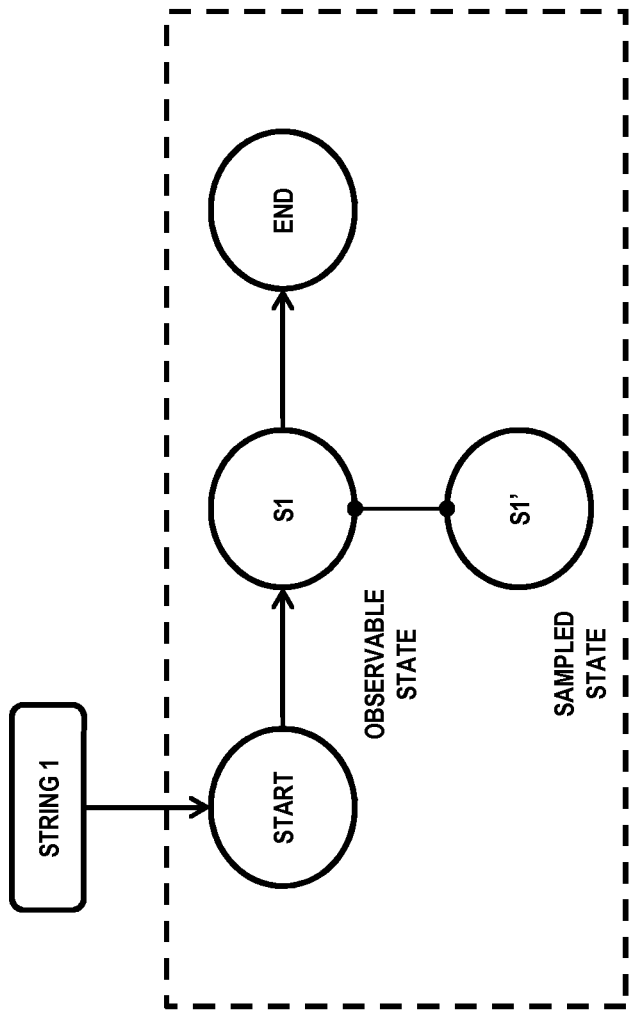
FIGS. 1B-1E are transition diagrams representing one exemplary algorithm used to extract patterns from data for generating a pattern-based database, according to an exemplary embodiment.

FIG. 1B illustrates a transition diagram illustrating the processing of a first string (e.g., STRING 1) based on the Hidden Markov Model as an exemplary model for determining patterns. When the first string is processed by the compression platform 103, the whole string assumes the first observable state S1. Because there are no previous strings to compare the first string to, any pattern can be identified within the first string. Further, the hidden or sampled state takes the same state S1'.

Figure 1C:
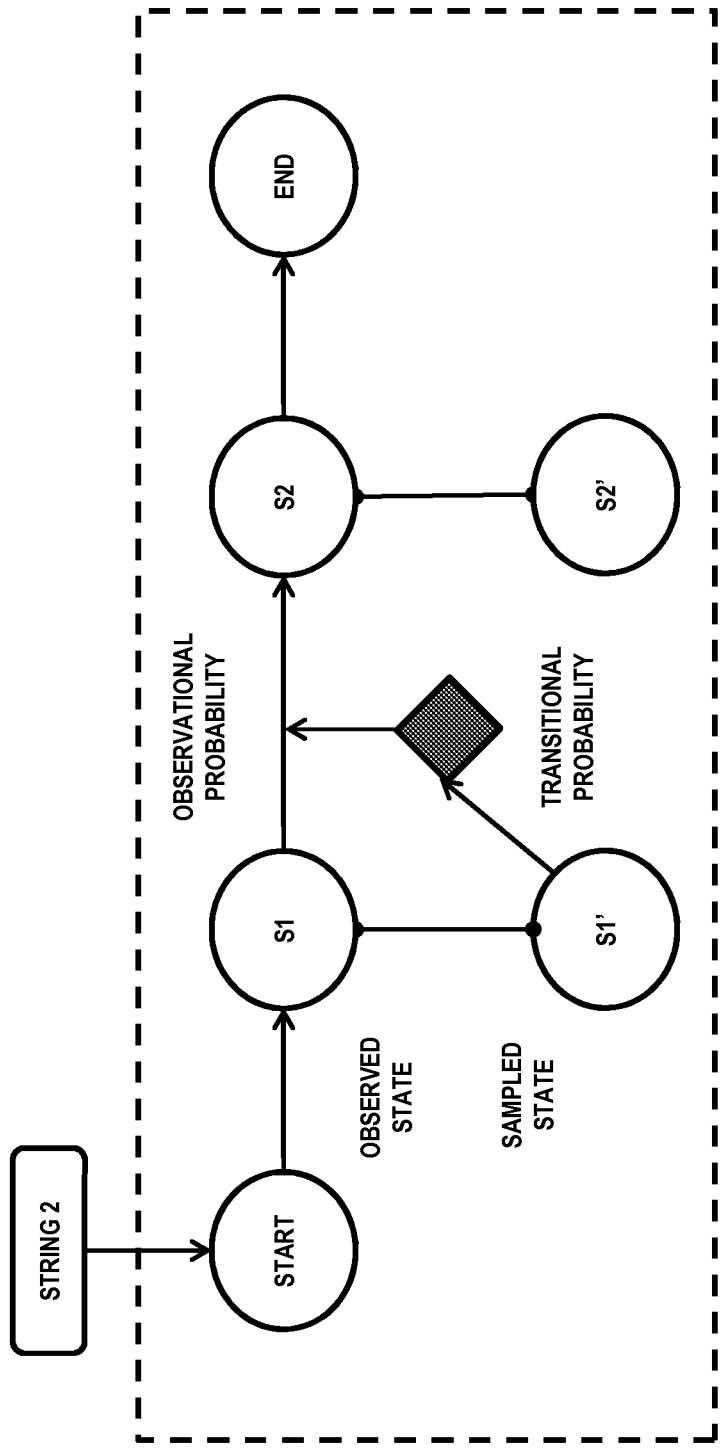
Figure 1D:
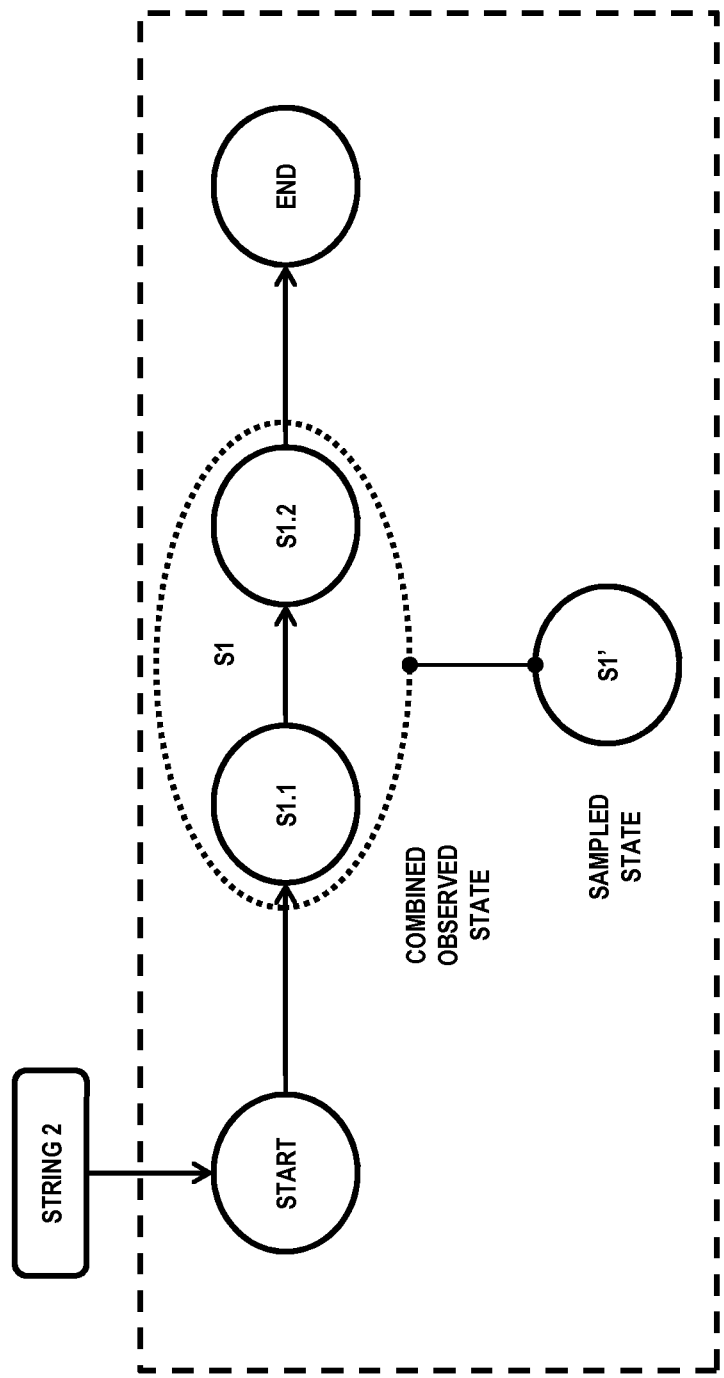

Next, as illustrated by the transition diagrams of FIGS. 1C and 1D, when the second string (e.g., STRING 2) is processed by the compression platform 103, the second string is checked against the observable state S1. During the comparison, one of the following cases can occur. Under a first case (i), when the second string is an exact match of the observable state S1, then the hidden state 1' is maintained and assumes the form of a pattern and the second string is tagged with the pattern or in this case the observable state S1. Under a second case (ii), as illustrated in FIG. 1C, when the second string is completely different from the observable state S1, then the second string assumes the state of a new observable state S2 and the hidden state is sampled as S2'. Under a third case (iii), as illustrated in FIG. 1D, when the second string is partially identified as a part of the observable state S1, then the compression platform 103 calculates the transitional probability of moving into a new observable state or being static at the old observable state. If the transitional probability is more than the observational probability, then a new observable state S2 forms as in case (ii), otherwise the case stays as described in case (i).

As subsequent strings are processed by the compression platform 103, the same procedure as discussed above is followed and is preformed recursively until the transitional probability remains almost static and does not exceed the observational probability. When the transitional probability remains static, the observable states of different strings with similar patterns are grouped and the strings themselves are maintained as sub-states to help in tagging (e.g., FIG. 1D).

Figure 1E:
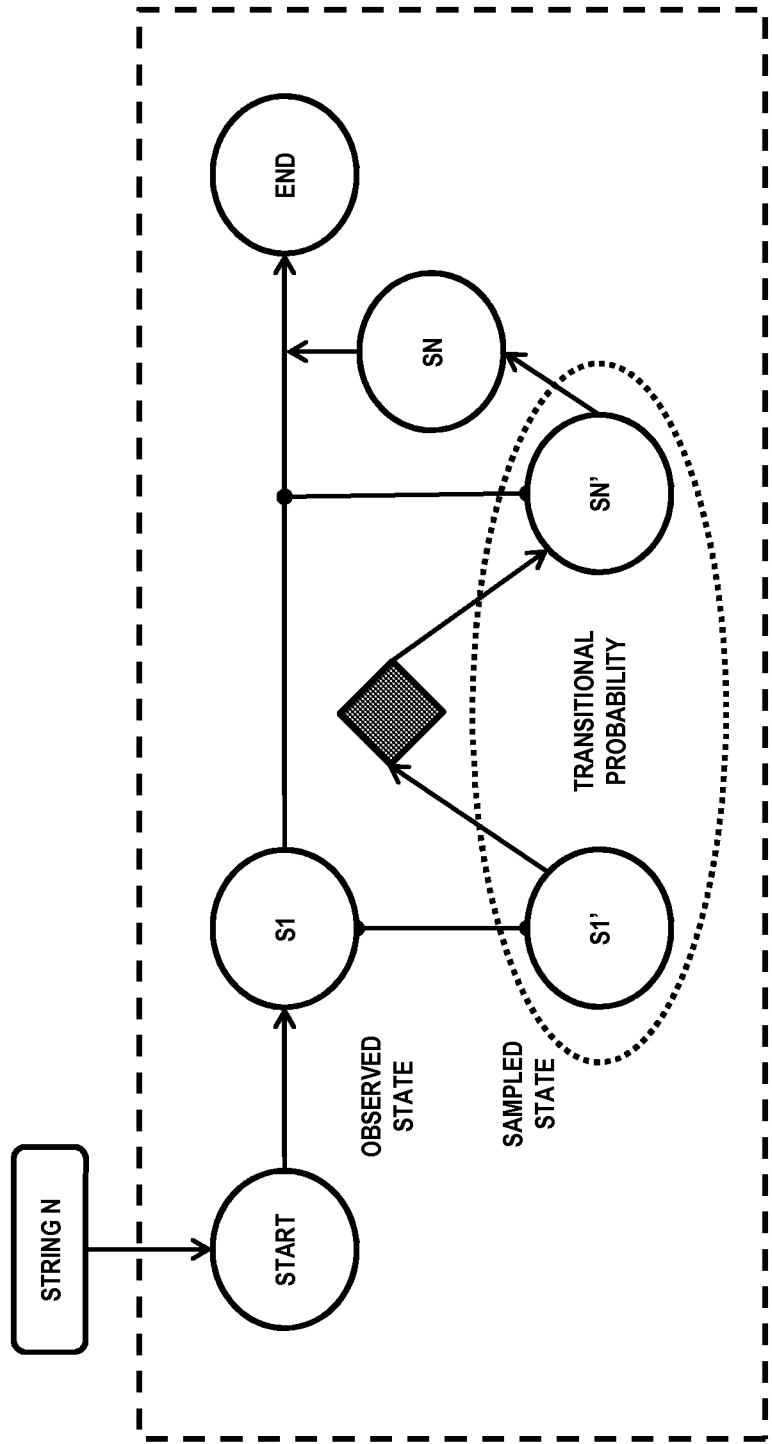

As illustrated by the transition diagram of FIG. 1E, where, for example, an input string that causes the identification of a new pattern and a change in the tagging of a set of already existing strings occurs, then a new sampled state SN' is created with a transitional probability more than that of the observational probability. Reiterating this cycle by the compression platform 103 allows for finding the closest match to an already existing hidden state or creating a new hidden state based on the probabilities of being observational or transitional.

It is contemplated that other models (in addition to the Hidden Markov Model) may be utilized to determine the patterns for data storage.

Figure 2:
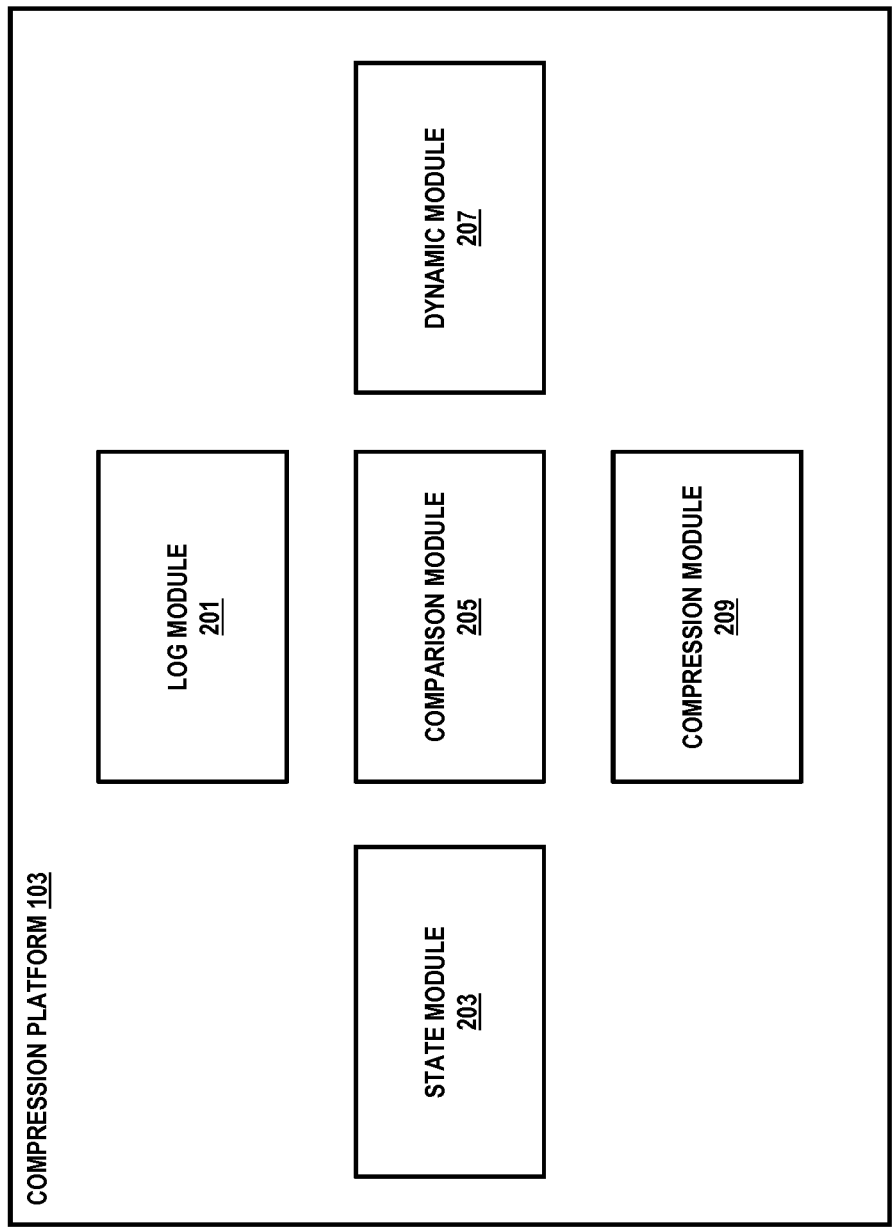
FIG. 2 is a diagram of a compression platform capable of generating a pattern-based database, according to an exemplary embodiment.

FIG. 2 is a diagram of an embodiment of the compression platform 103 used for generating a pattern-based database. The compression platform 103 includes a log module 201, a state module 203, a comparison module 205, a dynamic module 207 and a compression module 209. Although the compression platform 103 is illustrated as including the modules 201-209, in one or more embodiments, one or more of the modules 201-209 may be combined into another one of the modules.

In one embodiment, the compression platform 103 includes the log module 201. The log module 201 may determine the one or more logs 117a-117d within the system 101 from which the compression platform 103 accesses one or more strings representing data stored within the logs. Where the logs 117a-117d store information in a format other than a string, such as a relational database or other than key-value pairs, the log module 201 may perform processing on the log information to translate the log information into a format for additional processing by the compression platform 103, such as a string of key-value pairs. In one embodiment, the log module 201 further interfaces with the pattern-based database 105 for storing the compressed strings as records within the pattern-based database 105. Where the pattern-based database 105 is within one or more logs 117a-117d of the system 101, the log module 201 interfaces with the logs 117a-117d for determining which ones of the logs 117a-117d to store the compressed records.

In one embodiment, the compression platform 103 includes the state module 203. The state module 203 may determine the one or more states that are used as patterns for compressing the strings. The states may be determined based on the static portions of the strings. When the compression platform 103 uses the Hidden Markov Model, as discussed above, the state module 203 may keep track of the various states, including the hidden state, that are determined from the strings and that are used for determining the probabilities of the transitional and observational states. The state module 203 further stores information relating to the states that correspond to the static portions of strings (e.g., log information).

In one embodiment, the compression platform 103 includes a comparison module 205. The comparison module 205 compares the strings from the log (or other information from the log) to determine the static and dynamic portions of the strings (information). As discussed above, the comparison may be recursive and/or iterative do determine static and dynamic portions of strings. By way of example, in comparing a first string with a second string, a first pattern may be determined. However, in comparing a second string with a one millionth string, a second pattern may be determined. The comparison module 205 may then recursively compare the strings based on, for example, the result of the comparison of the one millionth string and the second string to see if the pattern determined between the first string and the second string is affected. The comparison module 205 stops the comparison based on the function of the recursion and/or iteration. By way of example, where the comparison is based on the Hidden Markov Model discussed above, the comparison may stop when the transitional probability is static.

In one embodiment, the compression platform 103 includes a dynamic module 207. The dynamic module 207 determines the dynamic portions of the strings based on the comparison performed by the comparison module 205 and the states that are determined based on the static portions of the strings. In one embodiment, the dynamic module 207 may also determine whether values within the strings, such as values associated with key-value pairs, are partially dynamic and/or static. In which case, the dynamic portions of the strings may be further segmented based on static and dynamic portions of respective values, rather than based on the entirety of values as being static or dynamic.

The compression module 209 compresses the string (information) from the logs 117a-117d based on the determined patterns associated with the states and static portions of the strings, and the dynamic portions of the strings. In one embodiment, the compression module 209 stores the compressed strings as records in the pattern-based database 105. In one embodiment, the compression module 209 may store the compressed strings as records in one or more of the logs 117a-117d from where the strings where retrieved.

Figure 3:
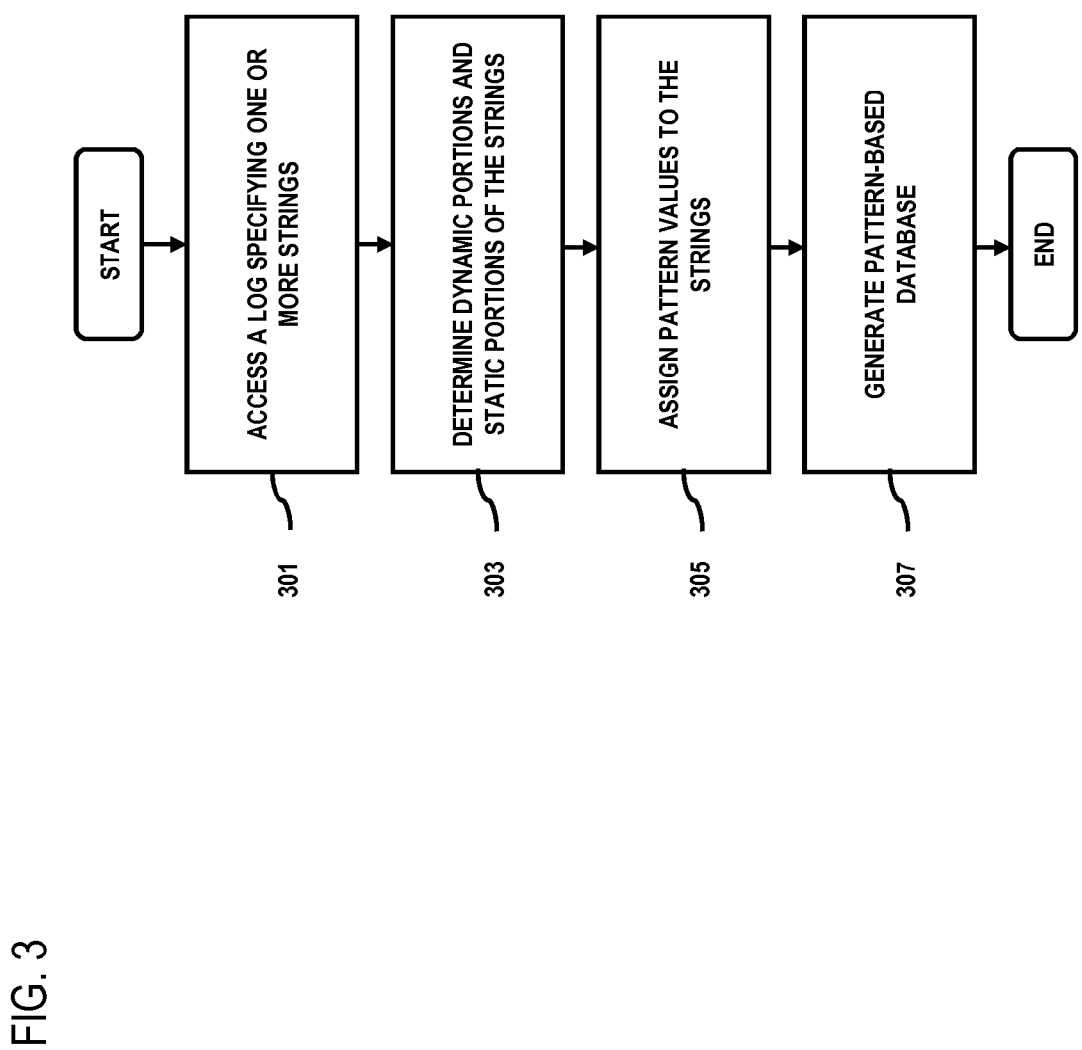
FIG. 3 is a flowchart of a process for generating a pattern-based database, according to one embodiment.
Figure 7:
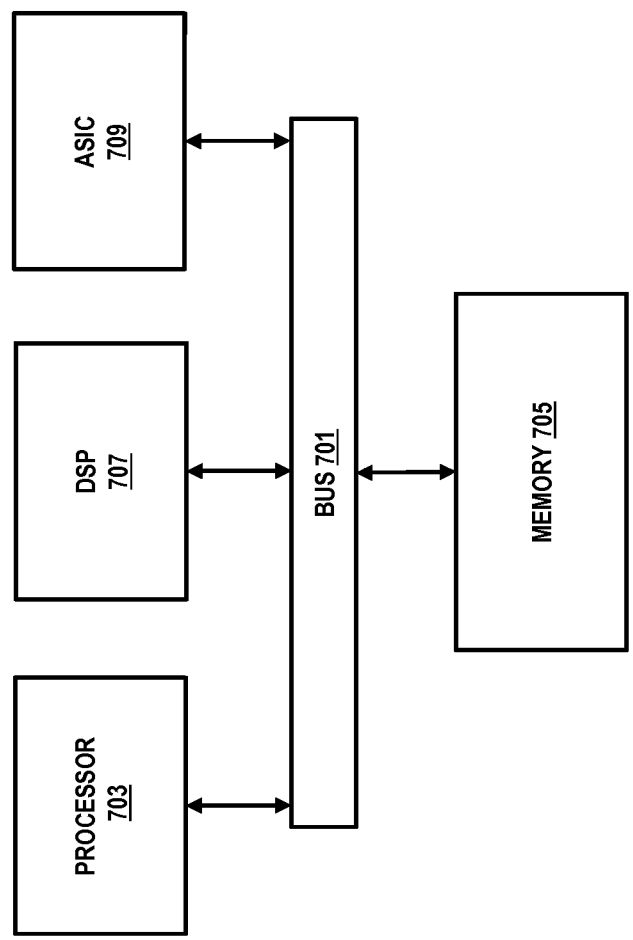
FIG. 7 is a diagram of a chip set that can be used to implement various exemplary embodiments.

FIG. 3 is a flowchart of a process for generating a pattern-based database, according to one embodiment. In one embodiment, the compression platform 103 performs the process 300 and is implemented in, for instance, a chip set including a processor and a memory as shown in FIG. 7.

In step 301, the compression platform 103 accesses a log that specifies one or more strings representing data having a dynamic portion and a static portion. By way of example, a log may contain millions of strings representing log information corresponding to one or more processes and/or functions that are executed by a system (e.g., the system 101). In one embodiment, the strings may be in the form of key-value pairs that correspond to variables and definitions of the variables that make-up processes in the system 101. However, the compression platform 103 may accommodate other formats for the strings (or information in general), such as relational tables, as discussed above.

In step 303, the compression platform 103 determines the dynamic portions and the static portions of the strings. The compression platform 103 may determine the dynamic portions and the static portions according various methods. Determining the dynamic portions and the static portions may be recursive and/or iterative to determine a subset of static portions that may be used to determine patterns in the data that may be used to compress the data. In one embodiment, the compression platform 103 may use the Hidden Markov Method as discussed above.

In step 305, the compression platform 103 assigns pattern values to the strings based on the determined dynamic portions and the static portions. The pattern values replace the static portions of the strings and indicate the location within the pattern value where the dynamic portions are inserted. The pattern values allow for compressing the strings while still maintaining the information at a small granular level. In other words, based on the pattern values and the dynamic portions, the original strings can be reproduced in an efficient manner despite achieving compression of the strings.

Then, in step 307, the compression platform 103 generates a pattern-based database including one or more records representing compression of the data based on the pattern values and the dynamic values. The pattern-based database may be separate from the one or more logs that contained the original strings (e.g., the pattern-based database 105), or may be stored within one or more of the logs.

Figure 4:
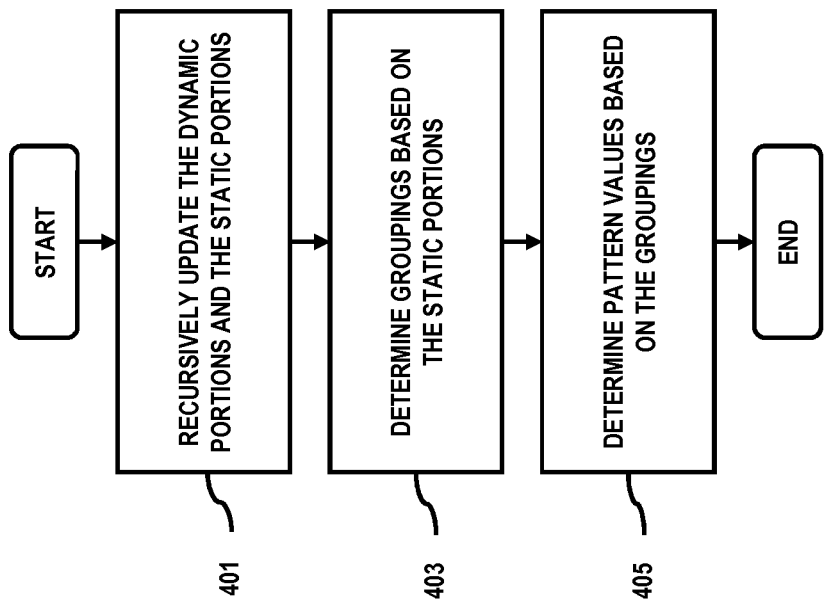
FIG. 4 is a flowchart of a process for determining pattern values based on recursively updating the static and dynamic portions of strings, according to one embodiment.

FIG. 4 is a flowchart of a process for determining pattern values based on recursively updating the static and dynamic portions of the strings, according to one embodiment. In one embodiment, the compression platform 103 performs the process 400 and is implemented in, for instance, a chip set including a processor and a memory as shown in FIG. 7.

In step 401, the compression platform 103 recursively updates the dynamic portions and the static portions of the one or more strings based on comparisons between the one or more strings. Based on the recursive updating, the compression platform 103 can determine patterns in the strings that reveal static portions and dynamic portions. By way of example, after processing a first set of strings from a log, a first pattern may be determined based on similarities between the static portion and the dynamic portions of the strings. However, processing of additional strings may reveal additional static portions. Further, the additional static portions may be used to determine different static portions in the initial set of strings. The recursive updating of the static portions and the dynamic portions allows for determining static portions and dynamic portions to increase the efficiency of the compressing, particularly where, as in many cases, there are millions of strings of information stored in the logs. By way of example, step 401 may be performed according to the Hidden Markov Model discussed above.

In step 403, the compression platform 103 determines groupings of the one or more strings being processed based on the static portions determined from step 401. In one embodiment, the groupings may be based on what strings have identical static portions. In one embodiment, the groupings may be based on what strings have similar static portions. The similarity may be based on some threshold, such as a number of similar characters as compared to a state used in determining the dynamic and static portions of the strings. The similarity may be based on the transitional probabilities as discussed above where, for example, the Hidden Markov Model is used to determine the dynamic and the static portions.

Based on the groupings of the one or more strings based on the static portions and the dynamic portions, the compression platform 103 in step 405 assigns pattern values to the one or more strings based on the groupings. The pattern values include the information from the static portions as well as place holders indicating where in the patterns (and therefore the static portions) the dynamic portions are inserted. Thus, strings that have been grouped together based on the pattern values are assigned the same pattern value. As discussed above, the pattern value is the static portion of the strings such that the pattern value combined with the dynamic portion can determine the original string.

Figure 5:
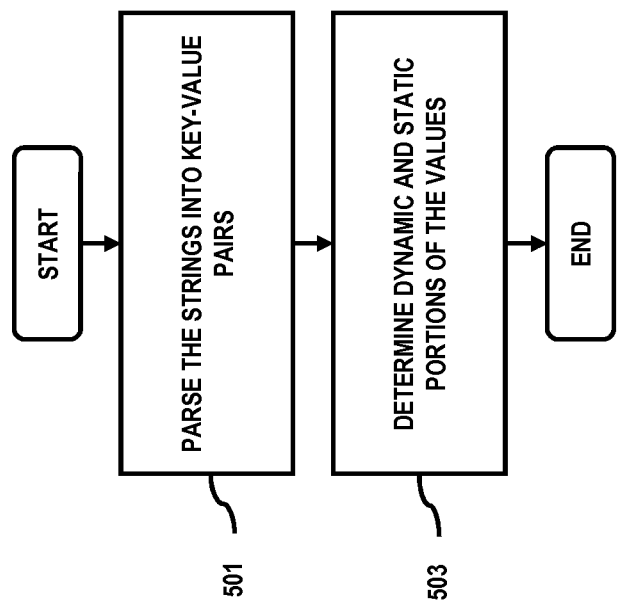
FIG. 5 is a flowchart of a process for determining dynamic and static portions of values of the one or more strings, according to one embodiment.

FIG. 5 is a flowchart of a process for determining dynamic and static portions of values of the one or more strings, according to one embodiment. In one embodiment, the compression platform 103 performs the process 500 and is implemented in, for instance, a chip set including a processor and a memory as shown in FIG. 7.

In one embodiment, in step 501, the compression platform 103 parses information in a log into one or more key-value pairs. This may occur when, for example, the one or more strings are not originally stored according to one or more key-value pairs or are not stored as strings but are instead stored in, for example, relational tables. At step 501, the compression platform 103 may further parse the strings to extract from the key-value pairs the values. The result may be an entire string of values without the keys.

In step 503, the compression platform 103 determines dynamic portions and static portions of values from the one or more key-value pairs. Thus, in one embodiment, the dynamic portions of the key-value pairs, such as the values, can be further broken down into dynamic portions and static portions, or partial static and dynamic portions. Under this approach, the compression may be further effectuated by including static portions of the values with the pattern values. By way of example, and as discussed above, if one key is DATE and the values are the date in the form of YYYY/MM/DD (e.g., year/month/day), strings that include the same year and month, and therefore repeat the same year and month in the values for the strings, may be further compressed by considering the year and the month as part of the static portion of the string while considering the day as part of the dynamic portion if, for example, there are enough variations in the day between the strings.

The processes described herein for generating a pattern-based database may be advantageously implemented via software, hardware, firmware or a combination of software and/or firmware and/or hardware. For example, the processes described herein, may be advantageously implemented via processor(s), Digital Signal Processing (DSP) chip, an Application Specific Integrated Circuit (ASIC), Field Programmable Gate Arrays (FPGAs), etc. Such exemplary hardware for performing the described functions is detailed below.

Figure 6:
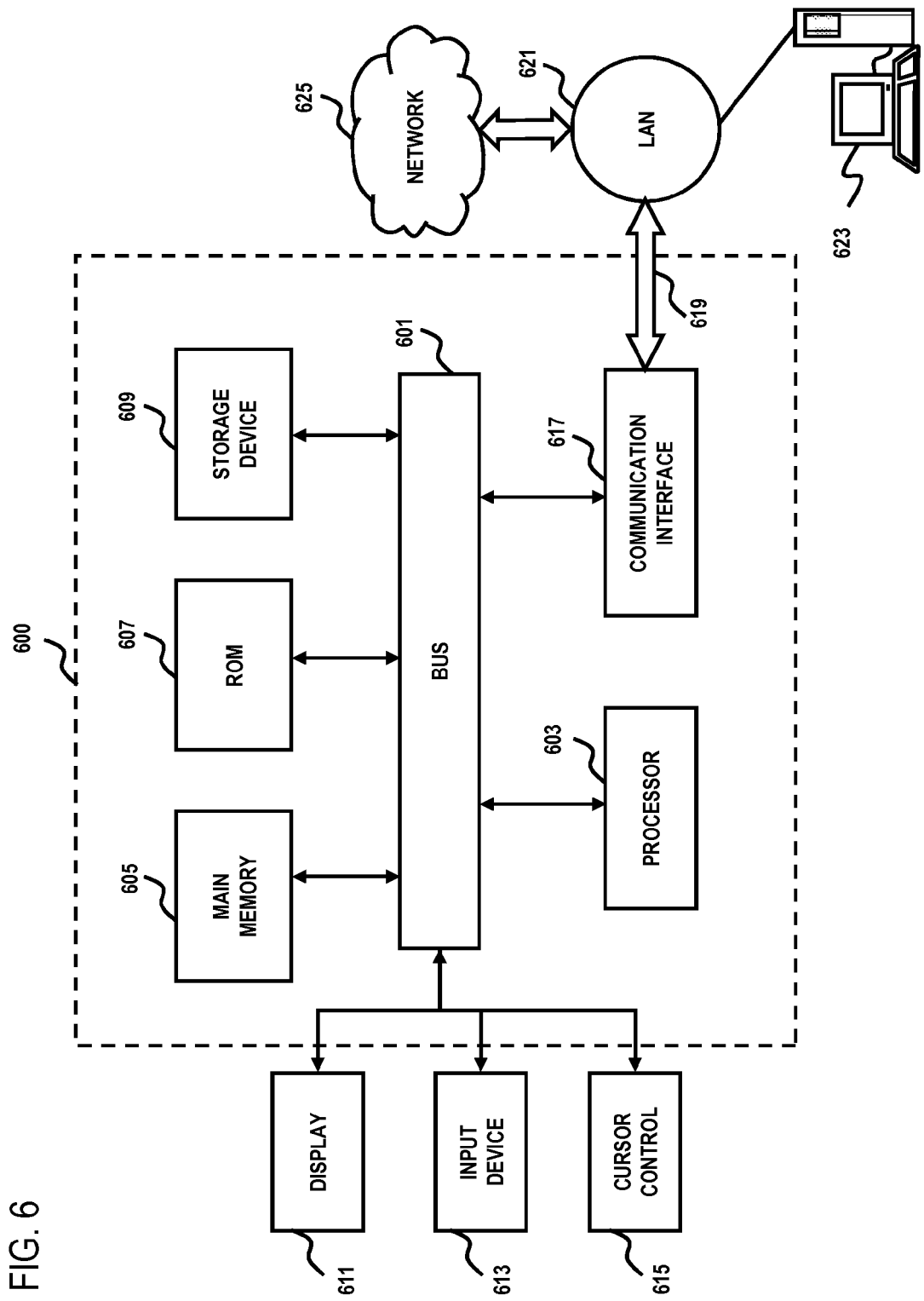
FIG. 6 is a diagram of a computer system that can be used to implement various exemplary embodiments.

FIG. 6 illustrates computing hardware (e.g., computer system) upon which an embodiment according to the invention can be implemented. The computer system 600 includes a bus 601 or other communication mechanism for communicating information and a processor 603 coupled to the bus 601 for processing information. The computer system 600 also includes main memory 605, such as random access memory (RAM) or other dynamic storage device, coupled to the bus 601 for storing information and instructions to be executed by the processor 603. Main memory 605 also can be used for storing temporary variables or other intermediate information during execution of instructions by the processor 603. The computer system 600 may further include a read only memory (ROM) 607 or other static storage device coupled to the bus 601 for storing static information and instructions for the processor 603. A storage device 609, such as a magnetic disk or optical disk, is coupled to the bus 601 for persistently storing information and instructions.

The computer system 600 may be coupled via the bus 601 to a display 611, such as a cathode ray tube (CRT), liquid crystal display, active matrix display, or plasma display, for displaying information to a computer user. An input device 613, such as a keyboard including alphanumeric and other keys, is coupled to the bus 601 for communicating information and command selections to the processor 603. Another type of user input device is a cursor control 615, such as a mouse, a trackball, or cursor direction keys, for communicating direction information and command selections to the processor 603 and for controlling cursor movement on the display 611.

According to an embodiment of the invention, the processes described herein are performed by the computer system 600, in response to the processor 603 executing an arrangement of instructions contained in main memory 605. Such instructions can be read into main memory 605 from another computer-readable medium, such as the storage device 609. Execution of the arrangement of instructions contained in main memory 605 causes the processor 603 to perform the process steps described herein. One or more processors in a multi-processing arrangement may also be employed to execute the instructions contained in main memory 605. In alternative embodiments, hard-wired circuitry may be used in place of or in combination with software instructions to implement the embodiment of the invention. Thus, embodiments of the invention are not limited to any specific combination of hardware circuitry and software.

The computer system 600 also includes a communication interface 617 coupled to bus 601. The communication interface 617 provides a two-way data communication coupling to a network link 619 connected to a local network 621. For example, the communication interface 617 may be a digital subscriber line (DSL) card or modem, an integrated services digital network (ISDN) card, a cable modem, a telephone modem, or any other communication interface to provide a data communication connection to a corresponding type of communication line. As another example, communication interface 617 may be a local area network (LAN) card (e.g. for Ethernet™ or an Asynchronous Transfer Mode (ATM) network) to provide a data communication connection to a compatible LAN. Wireless links can also be implemented. In any such implementation, communication interface 617 sends and receives electrical, electromagnetic, or optical signals that carry digital data streams representing various types of information. Further, the communication interface 617 can include peripheral interface devices, such as a Universal Serial Bus (USB) interface, a PCMCIA (Personal Computer Memory Card International Association) interface, etc. Although a single communication interface 617 is depicted in FIG. 6, multiple communication interfaces can also be employed.

The network link 619 typically provides data communication through one or more networks to other data devices. For example, the network link 619 may provide a connection through local network 621 to a host computer 623, which has connectivity to a network 625 (e.g. a wide area network (WAN) or the global packet data communication network now commonly referred to as the "Internet") or to data equipment operated by a service provider. The local network 621 and the network 625 both use electrical, electromagnetic, or optical signals to convey information and instructions. The signals through the various networks and the signals on the network link 619 and through the communication interface 617, which communicate digital data with the computer system 600, are exemplary forms of carrier waves bearing the information and instructions.

The computer system 600 can send messages and receive data, including program code, through the network(s), the network link 619, and the communication interface 617. In the Internet example, a server (not shown) might transmit requested code belonging to an application program for implementing an embodiment of the invention through the network 625, the local network 621 and the communication interface 617. The processor 603 may execute the transmitted code while being received and/or store the code in the storage device 609, or other non-volatile storage for later execution. In this manner, the computer system 600 may obtain application code in the form of a carrier wave.

The term "computer-readable medium" as used herein refers to any medium that participates in providing instructions to the processor 603 for execution. Such a medium may take many forms, including but not limited to non-volatile media, volatile media, and transmission media. Non-volatile media include, for example, optical or magnetic disks, such as the storage device 609. Volatile media include dynamic memory, such as main memory 605. Transmission media include coaxial cables, copper wire and fiber optics, including the wires that comprise the bus 601. Transmission media can also take the form of acoustic, optical, or electromagnetic waves, such as those generated during radio frequency (RF) and infrared (IR) data communications. Common forms of computer-readable media include, for example, a floppy disk, a flexible disk, hard disk, magnetic tape, any other magnetic medium, a CD-ROM, CDRW, DVD, any other optical medium, punch cards, paper tape, optical mark sheets, any other physical medium with patterns of holes or other optically recognizable indicia, a RAM, a PROM, and EPROM, a FLASH-EPROM, any other memory chip or cartridge, a carrier wave, or any other medium from which a computer can read.

Various forms of computer-readable media may be involved in providing instructions to a processor for execution. For example, the instructions for carrying out at least part of the embodiments of the invention may initially be borne on a magnetic disk of a remote computer. In such a scenario, the remote computer loads the instructions into main memory and sends the instructions over a telephone line using a modem. A modem of a local computer system receives the data on the telephone line and uses an infrared transmitter to convert the data to an infrared signal and transmit the infrared signal to a portable computing device, such as a personal digital assistant (PDA) or a laptop. An infrared detector on the portable computing device receives the information and instructions borne by the infrared signal and places the data on a bus. The bus conveys the data to main memory, from which a processor retrieves and executes the instructions. The instructions received by main memory can optionally be stored on storage device either before or after execution by processor.

FIG. 7 illustrates a chip set 700 upon which an embodiment of the invention may be implemented. Chip set 700 is programmed to generate a pattern-based database as described herein and includes, for instance, the processor and memory components described with respect to FIG. 6 incorporated in one or more physical packages (e.g., chips). By way of example, a physical package includes an arrangement of one or more materials, components, and/or wires on a structural assembly (e.g., a baseboard) to provide one or more characteristics such as physical strength, conservation of size, and/or limitation of electrical interaction. It is contemplated that in certain embodiments the chip set can be implemented in a single chip. Chip set 700, or a portion thereof, constitutes a means for performing one or more steps of FIGS. 3-5.

In one embodiment, the chip set 700 includes a communication mechanism such as a bus 701 for passing information among the components of the chip set 700. A processor 703 has connectivity to the bus 701 to execute instructions and process information stored in, for example, a memory 705. The processor 703 may include one or more processing cores with each core configured to perform independently. A multi-core processor enables multiprocessing within a single physical package. Examples of a multi-core processor include two, four, eight, or greater numbers of processing cores. Alternatively or in addition, the processor 703 may include one or more microprocessors configured in tandem via the bus 701 to enable independent execution of instructions, pipelining, and multithreading. The processor 703 may also be accompanied with one or more specialized components to perform certain processing functions and tasks such as one or more digital signal processors (DSP) 707, or one or more application-specific integrated circuits (ASIC) 709. A DSP 707 typically is configured to process real-world signals (e.g., sound) in real time independently of the processor 703. Similarly, an ASIC 709 can be configured to performed specialized functions not easily performed by a general purposed processor. Other specialized components to aid in performing the inventive functions described herein include one or more field programmable gate arrays (FPGA) (not shown), one or more controllers (not shown), or one or more other special-purpose computer chips.

The processor 703 and accompanying components have connectivity to the memory 705 via the bus 701. The memory 705 includes both dynamic memory (e.g., RAM, magnetic disk, writable optical disk, etc.) and static memory (e.g., ROM, CD-ROM, etc.) for storing executable instructions that when executed perform the inventive steps described herein to controlling a set-top box based on device events. The memory 705 also stores the data associated with or generated by the execution of the inventive steps.

While certain exemplary embodiments and implementations have been described herein, other embodiments and modifications will be apparent from this description. Accordingly, the invention is not limited to such embodiments, but rather to the broader scope of the presented claims and various obvious modifications and equivalent arrangements.

What is claimed is:

1. A method comprising:
accessing log data specifying one or more strings having at least one dynamic portion and at least one static portion; and
generating a pattern-based database, including one or more records representing compression of the log data, by:
parsing the one or more strings into one or more key-value pairs;
determining dynamic portions and static portions of values of the one or more key-value pairs of the strings by comparing a plurality of the one or more key-value pairs;
assigning pattern values and dynamic values to the strings based on the determined dynamic portions and the static portions,
wherein the pattern values include at least one determined static portion and indicate at least one location associated with at least one determined dynamic portion, and
wherein the pattern values and dynamic values are configured to provide compression of the strings within the records of the pattern-based database, and
recursively updating the dynamic portions and the static portions of the one or more strings based on the comparisons between the one or more key-value pairs,
wherein the updating includes designating at least one assigned dynamic value and/or assigned pattern value as partially dynamic or partially static, and
wherein the updated pattern values and/or updated dynamic values are configured to provide additional compression of the strings within the records of the pattern-based database.

2. The method according to claim 1, wherein the log data is associated with one or more processes and/or functions of at least one system in a service provider network.

3. The method according to claim 1, wherein the determining comprises:
determining groupings of the one or more strings based on the static portions; and
determining the pattern values based on the groupings;
wherein the groupings of the one or more strings are determined based on the recursive updating of the dynamic portions and the static portions.

4. The method according to claim 3, further comprising: determining a state based on a first string of the one or more strings; and determining a similarity between the state and a second string of the one or more strings, wherein the recursive updating is based on the similarity.

5. The method according to claim 1, wherein the dynamic portions of the one or more strings are based on the dynamic portions of the values.

6. The method according to claim 1, wherein the static portions of the one or more strings are based in part on the static portions of the values.

7. The method according to claim 1, further comprising:
processing data from the log data to determine a plurality of values; and
combing the plurality of values into strings to generate the one or more strings,
wherein the dynamic portions are dynamic portions of the plurality of values and the static portions are static portions of the plurality of values.

8. An apparatus comprising:
a communication port configured to provide access to log data specifying one or more strings having at least one dynamic portion and at least one static portion; and
a processor configured to generate a pattern-based database, including one or more records representing compression of the log data, the processor configured to:
parse the one or more strings into one or more key-value pairs;
determine dynamic portions and static portions of values of the one or more key-value pairs of the strings by comparing a plurality of the one or more key-value pairs;
assign pattern values and dynamic values to the strings based on the determined dynamic portions and the static portions,
wherein the pattern values include at least one determined static portion and indicate at least one location associated with at least one determined dynamic portion,
wherein the pattern values are configured to provide compression of the strings within the records of the pattern-based database, and
recursively update the dynamic portions and the static portions of the one or more strings based on the comparisons between the one or more key-value pairs,
wherein the updating includes designating at least one assigned dynamic value and/or assigned pattern value as partially dynamic or partially static,
wherein the updated pattern values and/or updated dynamic values are configured to provide additional compression of the strings within the records of the pattern-based database.

9. The apparatus according to claim 8, wherein the log data is associated with one or more processes and/or functions of at least one system in a service provider network.

10. The apparatus according to claim 8, the processor being further configured to:
determine groupings of the one or more strings based on the static portions, and
determine the pattern values based on the groupings,
wherein the groupings of the one or more strings are determined based on the recursive updating of the dynamic portions and the static portions.

11. The apparatus according to claim 10, the processor being further configured to:
determine a state based on a first string of the one or more strings; and
determine a similarity between the state and a second string of the one or more strings, wherein the recursive updating is based on the similarity.

12. The apparatus according to claim 8, wherein the dynamic portions of the one or more strings are based on the dynamic portions of the values.

13. The apparatus according to claim 8, wherein the static portions of the one or more strings are based in part on the static portions of the values.

14. The apparatus according to claim 8, the processor being further configured to:
process data from the log data to determine a plurality of values; and
combine the plurality of values into strings to generate the one or more strings,
wherein the dynamic portions are dynamic portions of the plurality of values and the static portions are static portions of the plurality of values.

15. A system comprising:
a processor;
a log configured to store one or more strings representing log data, the one or more strings having at least one dynamic portion and at least one static portion; and
a compression platform configured to, utilizing the processor, access the log data and generate a pattern-based database, including one or more records representing compression of the data by being configured to:
parse the one or more strings into one or more key-value pairs;
determine dynamic portions and static portions of values of the one or more key-value pairs of the strings by comparing a plurality of the one or more key-value pairs;
assign pattern values and dynamic values to the strings based on the determined dynamic portions and the static portions,
wherein the pattern values include at least one determined static portion and indicate at least one location associated with at least one determined dynamic portion,
wherein the pattern values are configured to provide compression of the strings within the records of the pattern-based database, and
recursively update the dynamic portions and the static portions of the one or more strings based on the comparisons between the one or more key-value pairs,
wherein the updating includes designating at least one assigned dynamic value and/or assigned pattern value as partially dynamic or partially static,
wherein the updated pattern values and/or updated dynamic values are configured to provide additional compression of the strings within the records of the pattern-based database.

16. The system according to claim 15, wherein the log data is associated with one or more processes and/or functions of at least one system in a service provider network pattern values replace the static portions of the strings and indicate the location within the pattern values of the dynamic portions.

17. The system according to claim 15, wherein the compression platform is further configured to:
determine groupings of the one or more strings based on the static portions, and
determine the pattern values based on the groupings,
wherein the groupings of the one or more strings are determined based on the recursive updating of the dynamic portions and the static portions.

18. The system according to claim 17, wherein the compression platform is further configured to:
determine a state based on a first string of the one or more strings; and
determine a similarity between the state and a second string of the one or more strings,
wherein the recursive updating is based on the similarity.

* * * * *